(12) United States Patent
Nakatani et al.

(10) Patent No.: US 6,719,914 B2
(45) Date of Patent: Apr. 13, 2004

(54) METHOD OF MANUFACTURING PIEZOELECTRIC DEVICE USING DIRECT BONDED QUARTZ PLATE

(75) Inventors: Masaya Nakatani, Takarazuka (JP); Michihiko Hayashi, Fukui (JP); Hirofumi Tajika, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 115 days.

(21) Appl. No.: 10/132,717

(22) Filed: Apr. 26, 2002

(65) Prior Publication Data

US 2002/0177313 A1 Nov. 28, 2002

(30) Foreign Application Priority Data

Apr. 27, 2001 (JP) .......................................... 2001-131431

(51) Int. Cl.[7] .............................................. C03C 15/00
(52) U.S. Cl. ............................ 216/36; 216/57; 216/67; 216/79; 216/80; 216/97
(58) Field of Search ................................ 216/36, 57, 67, 216/79, 80, 97

(56) References Cited

U.S. PATENT DOCUMENTS

5,438,343 A * 8/1995 Khan et al. .................. 313/493
6,407,485 B1 * 6/2002 Aratake ....................... 310/344

FOREIGN PATENT DOCUMENTS

JP         2000258167 A    *  9/2000    ............ G01C/19/56

OTHER PUBLICATIONS

Bonding Together Surfaces Coated with Silicon Dioxide, IBM Technical Disclosure Bulletin, vol. 19, Isuue 7, pp. 2777–2778; TDB–ACC–NO: NN76122777, Dec. 1, 1976.*

* cited by examiner

*Primary Examiner*—Allan Olsen
(74) *Attorney, Agent, or Firm*—McDermott, Will & Emery

(57) ABSTRACT

The present invention relates to a method of manufacturing a piezoelectric device of high sensitivity using direct bonded quartz plate. To achieve this object, the invented method comprises the steps of covalently bonding a plurality of quartz plates, dry etching the bonded quartz plates with plasma from one side of its surfaces down to a bonded plane, and dry etching with plasma thereafter from the other side of the surfaces.

18 Claims, 7 Drawing Sheets

METHOD OF MANUFACTURING PIEZOELECTRIC DEVICE USING DIRECT BONDED QUARTZ PLATE

FIELD OF THE INVENTION

The present invention relates to a method of manufacturing piezoelectric devices for use as sensors, actuators and the like of various kinds and, in particular, to the piezoelectric devices using direct bonded quartz plate.

BACKGROUND OF THE INVENTION

An example of the prior art method will be described with reference to FIG. 16 to FIG. 20.

A direct bonded quartz plate consists of two quartz plates 1 and 2, which are put together as shown in FIG. 16, and heated while being held together. The process of heating evaporates moisture present in bonding planes of both the plates, and facilitates bonding between these planes via oxygen atoms as intermediates.

The quartz plates bonded in this manner are provided with gold masks 3 and 4 on respective surfaces, and the quartz plates are dissolved simultaneously from both the surfaces by wet etching, as shown in FIG. 17. A process of cutting through the quartz plates is completed by the dissolution, as shown in FIG. 18, and this produces small chips of direct bonded quartz plate 5 as illustrated in FIG. 19. Following the above process, direct bonded quartz plate 5 is dissolved further by wet etching from both sides using upper and lower gold masks 3 and 4, to calibrate a resonance frequency as a resonator by way of adjusting a weight thereof, as shown in FIG. 20. This direct bonded quartz resonator is used for sensor and actuator as stated above.

A problem associated with the above example of the prior art has been that a sensitivity of the resonator constructed of the direct bonded quartz plate decreases in the wet etching process. The purpose of bonding the quartz plates 1 and 2, of which polarization axes are reversed, is to obtain twice as high sensitivity. However, the process of wet etching exposed sides of the quartz plates for calibration of the resonance frequency causes the quartz plates unsymmetrical in sectional shape of the dissolved surfaces as shown in FIG. 19, because of a difference in dissolvability attributable to crystal lattice of the quartz plates. When the dissolving process is continued further, the dissolution advances greatly toward an interior of lines Z—Z in the area of direct bond of the quartz plates 1 and 2, as shown in FIG. 20. Lines Z—Z in FIG. 20 are finite lines connecting between edges of upper and lower electrodes.

Dissolved portion 102 is an area where upper and lower quartz plates 1 and 2 are not bonded together. In other words, it reduces a bonded area of quartz plates 1 and 2 between the confronting upper and lower electrodes, and decreases the sensitivity as a consequence.

SUMMARY OF THE INVENTION

The present invention is intended to improve sensitivity of the direct bonded quartz piezoelectric device.

In order to achieve this object, the present invention discloses a method comprising the steps of directly bonding at least two quartz plates, dry etching the bonded quartz plates with plasma from one side of its surfaces, and dry etching the bonded quartz plates with plasma thereafter from the other side of the surfaces.

That is, the dry etching takes a task of physical cutting when the bonded quartz plates are dry-etched with plasma from one side and then from the other side of the surfaces as described above. Therefore, unlike the prior art method of using wet etching, this method hardly causes deformation due to the difference in etching rate of the quartz surfaces.

In other words, when the plasma dry etching is made on the front and back surfaces in this manner, the bonded quartz plates become such a shape that the perimeter protrudes outwardly around the bonded plane. Once the quartz plates are formed into the protuberant shape, there is produced only a shallow slit cut into the quartz plates at the protuberant ridge along the bonded plane, even after resonance frequency calibration is made by dissolving them with such a process as wet etching. If the cut-in slit is only so shallow as in this instance, a bonded area of the original quartz plates is not reduced, and thereby the invention provides the piezoelectric device with high sensitivity.

Figure 14A:
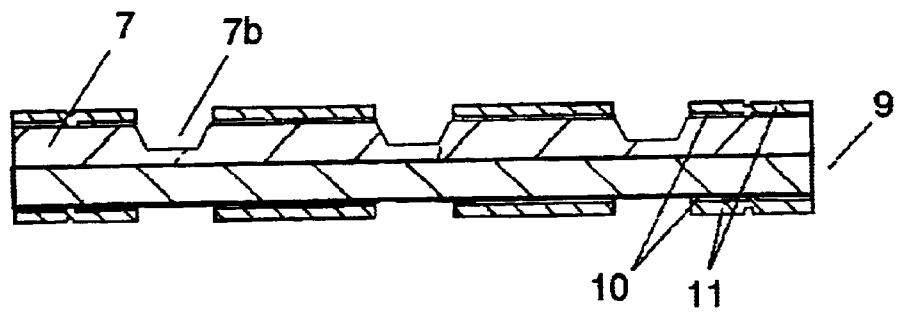
Figure 14B:
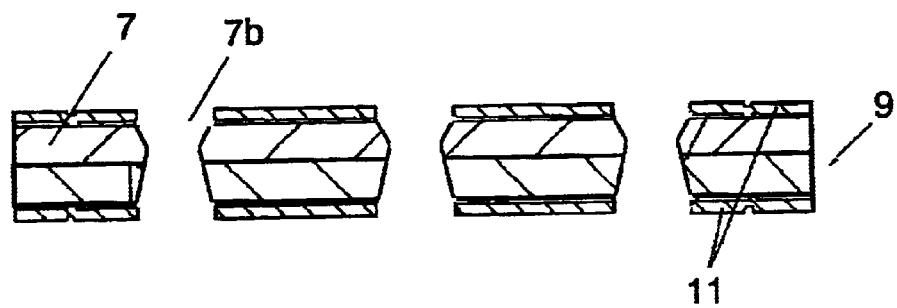
Figure 15A:
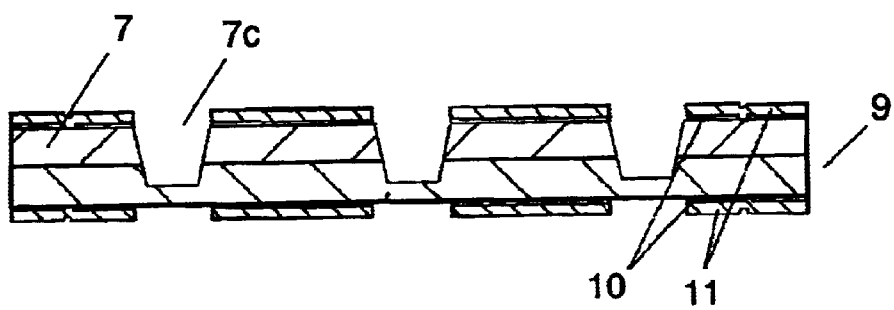
Figure 15B:
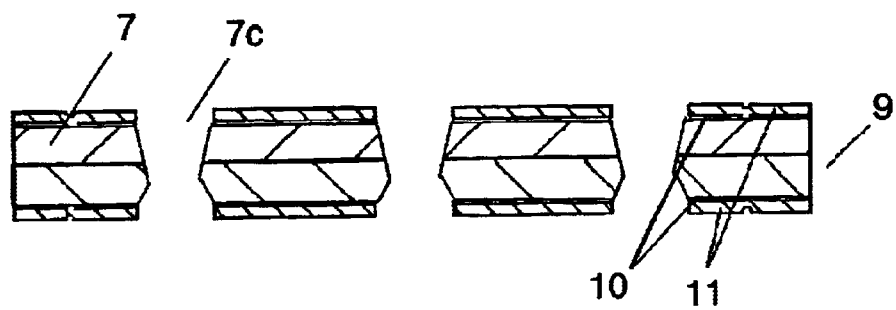
Figure 16:
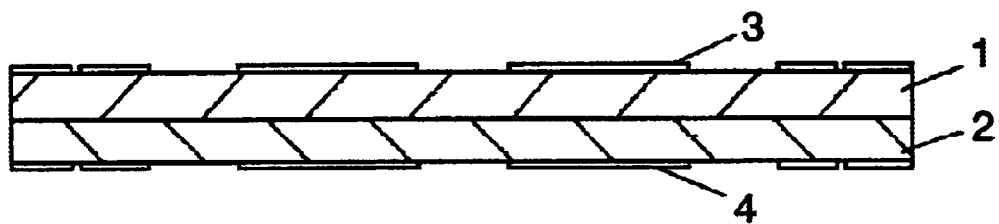
Figure 17:
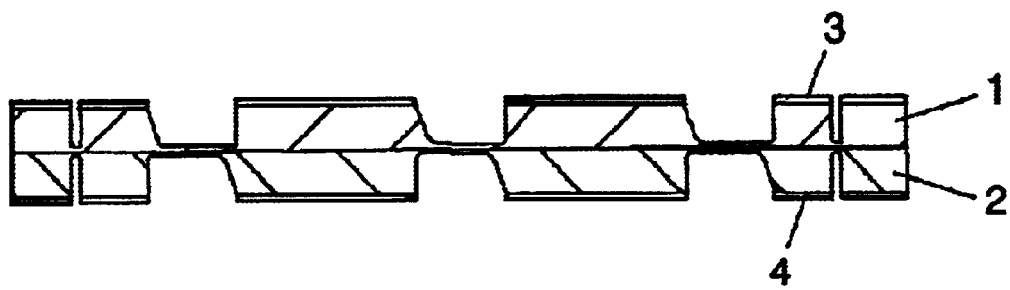
Figure 18:
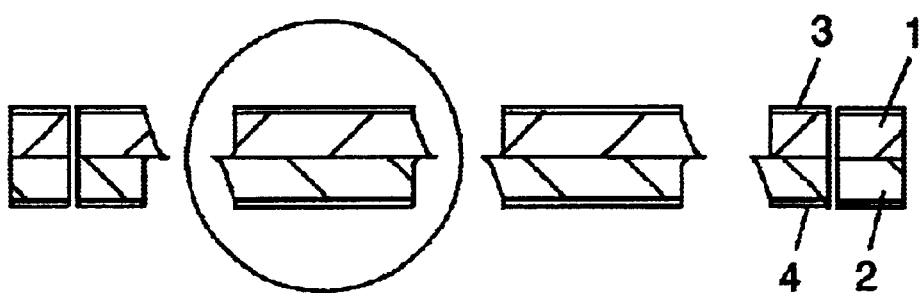
Figure 19:
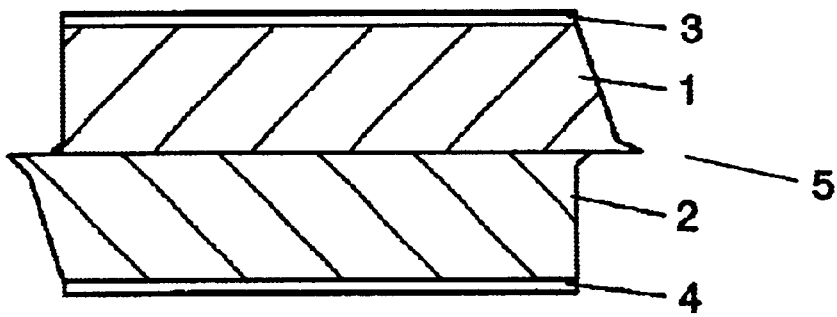
Figure 20:
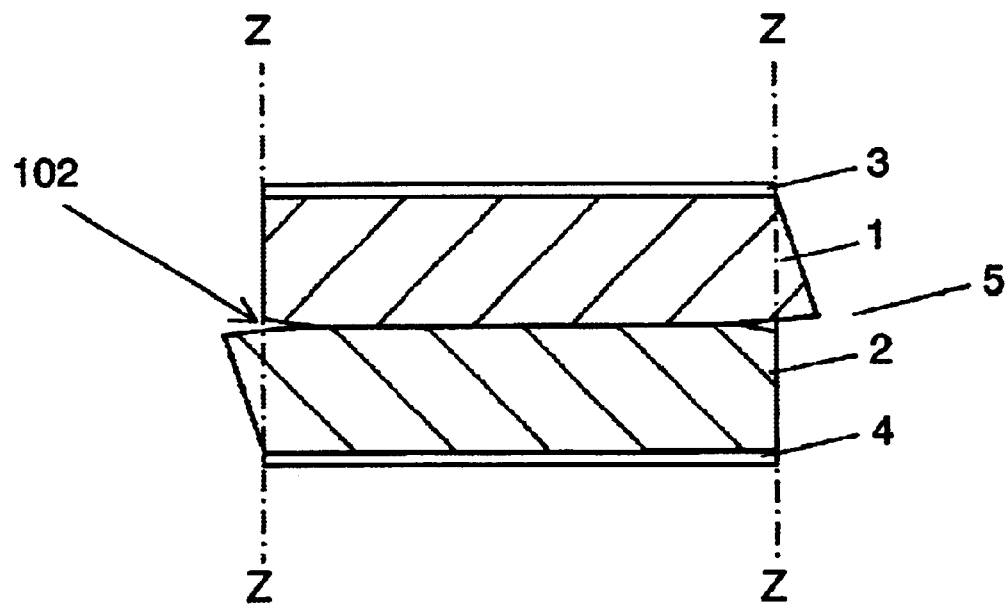

The FIG. 14A is a sectional view of a bonded quartz device in the midst of manufacturing process with undesirable condition according to any of the first and second exemplary embodiments of this invention;

FIG. 14B is a sectional view of another bonded quartz device in the midst of manufacturing process with undesirable condition according to any of the first and second exemplary embodiments of this invention;

FIG. 15A is a sectional view of still another bonded quartz device in the midst of manufacturing process with undesirable condition according to any of the first and second exemplary embodiments of this invention;

FIG. 15B is a sectional view of yet another bonded quartz device in the midst of manufacturing process with undesirable condition according to any of the first and second exemplary embodiments of this invention;

FIG. 16 is a sectional view of a bonded quartz device in the midst of manufacturing process according to the conventional method;

FIG. 17 is another sectional view of the bonded quartz device in the midst of manufacturing process according to the conventional method;

FIG. 18 is another sectional view of the bonded quartz device in the midst of manufacturing process according to the conventional method;

FIG. 19 is still another sectional view of the bonded quartz device in the midst of manufacturing process according to the conventional method; and FIG. 20 is yet another sectional view of the bonded quartz device in the midst of manufacturing process according to the conventional method.

DETAILED DESCRIPTION OF THE PREFERRED EMBODIMENTS (First Exemplary Embodiment)

Figure 1A:
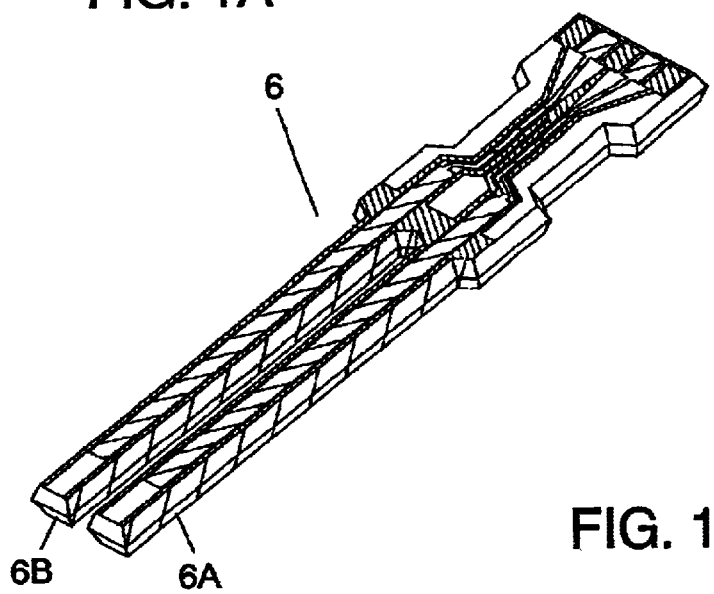
FIG. 1A is a perspective view of an angular velocity sensor using a bonded quartz device manufactured according to one of exemplary embodiments of the present invention.

A first exemplary embodiment of the present invention will be described hereinafter with reference to the accompanying drawings. FIG. 1A shows a tuning fork type angular velocity sensor used in an automobile, for example, and the like. Tuning fork type angular velocity sensor 6 of this kind is manufactured following the steps shown in FIG. 2 through FIG. 10. As the first exemplary embodiment, a method of this invention for manufacturing a piezoelectric device using direct bonded quartz plate is discussed for the case of manufacturing an angular velocity sensor.

Figure 2:
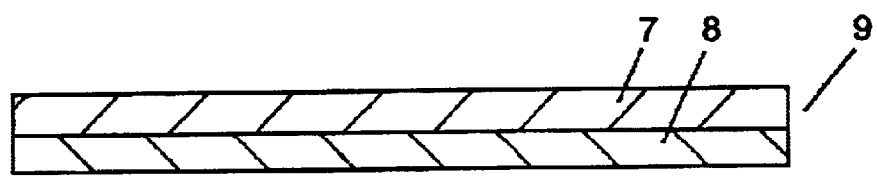
FIG. 2 is a sectional view of a bonded quartz device in the midst of manufacturing process according to first exemplary embodiment of this invention.

First, bonding planes of two quartz plates 7 and 8 are thoroughly polished. While these planes are kept very clean, they are put together as shown in FIG. 2, and heated thereafter. The heating evaporates moisture present in the bonding planes, and as a result, forms a bond by commonly sharing oxygen atom.

Figure 3:
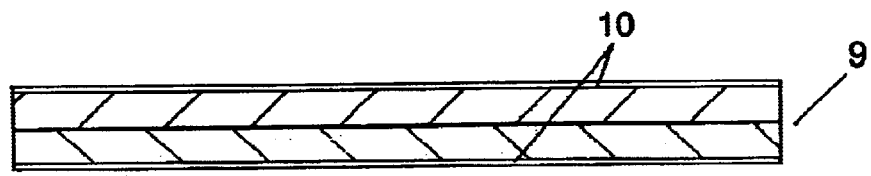
FIG. 3 is another sectional view of the bonded quartz device in the midst of manufacturing process according to the first exemplary embodiment of this invention.
Figure 4:
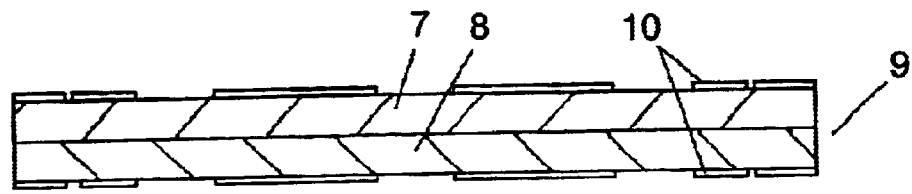
FIG. 4 is another sectional view of the bonded quartz device in the midst of manufacturing process according to the first exemplary embodiment of this invention.

Next, bonded quartz plate 9 constructed into one-piece structure as above is provided with gold mask 10 formed on each of the front and back surfaces, as shown in FIG. 3. Following the above, a resin photoresist is formed over gold mask 10, although not expository shown in the figure. After the photoresist is patterned into a predetermined shape, subsequent patterning is made on gold mask 10 by dissolving the gold with, for instance, iodine potassium iodide aqueous solution. FIG. 4 shows bonded quartz plate 9 after the resin photoresist is removed. That is, bonded quartz plate 9 shown in FIG. 4 bears identically patterned gold mask 10 on both of its front and back surfaces.

Figure 5:
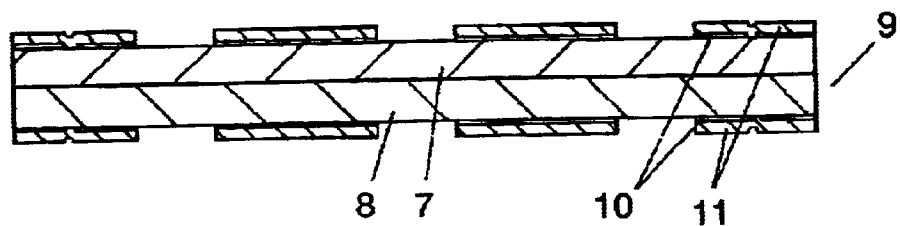
FIG. 5 is another sectional view of the bonded quartz device in the midst of manufacturing process according to the first exemplary embodiment of this invention.
Figure 6:
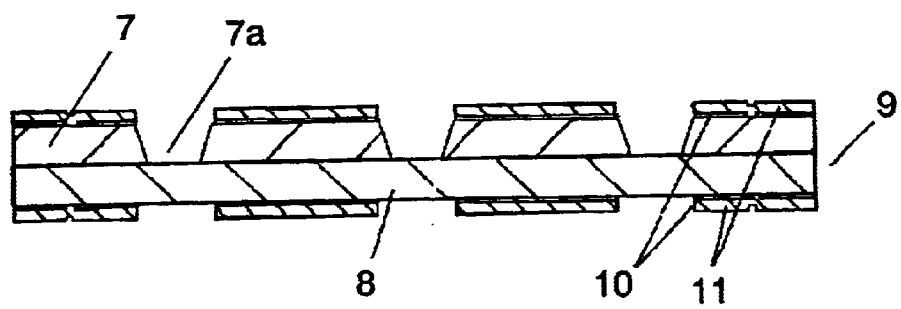
FIG. 6 is another sectional view of the bonded quartz device in the midst of manufacturing process according to the first exemplary embodiment of this invention.
Figure 7:
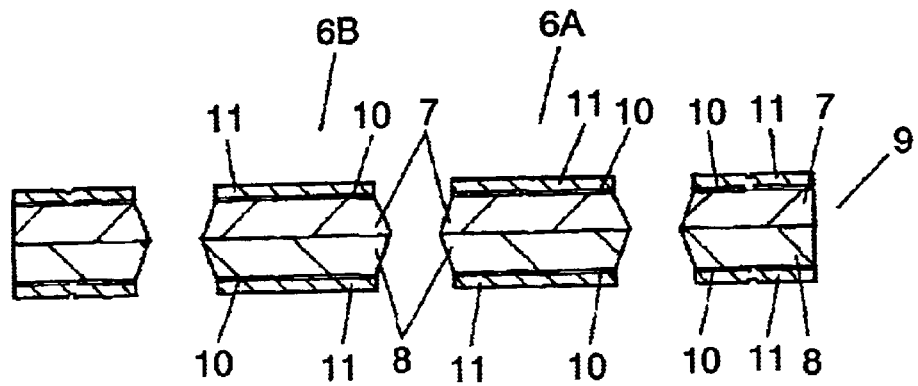
FIG. 7 is another sectional view of the bonded quartz device in the midst of manufacturing process according to the first exemplary embodiment of this invention.

Bonded quartz plate 9 in this state is then covered with nickel mask 11 on surfaces of gold mask 10 as shown in FIG. 5. Next, bonded quartz plate 9 is plasma dry-etched from one side surface, i.e. an upper surface in the example of FIG. 6, with etchant source gas comprised of a mixture of fluorine containing gas such as CF4, CHF3, C4F8, SF6 and the like, and inert gas such as argon, xenon and the like, using a radio-frequency plasma processing apparatus, as shown in FIG. 6. In this exemplary embodiment, a degree of vacuum of the ambient gasses was set to be 0.005–0.05 torr, and an etching rate to 0.3 $\mu$m/minute. The upper quartz plate is thus etched to form etched trench 7a down to a depth of the bonded plane. Bonded quartz plate 9 is again plasma dry-etched from the lower surface using the same etchant source gas as shown in FIG. 7. The plasma dry etching can be performed without being influenced by crystal orientation of the quartz plates because of high ion energy. The result is a device constructed of bonded quartz plate 9 as shown in FIG. 8.

Figure 8:
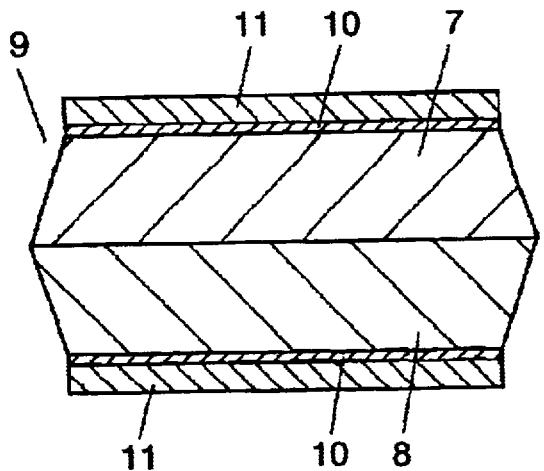
FIG. 8 is another sectional view of the bonded quartz device in the midst of manufacturing process according to the first exemplary embodiment of this invention.

Bonded quartz plate 9 takes such a shape that it protuberates outwardly with a protuberant ridge being along the bonded plane as shown in FIG. 8. Bonded quartz device 9 shown in FIG. 8 represents any one of devices 6A and 6B, which constitute angular velocity sensor 6 illustrated in FIG. 1A. Of the bonded quartz device 9 shown in FIG. 7, two segments at the right and the left in the center correspond to devices 6A and 6B of FIG. 1A respectively.

Figure 9:
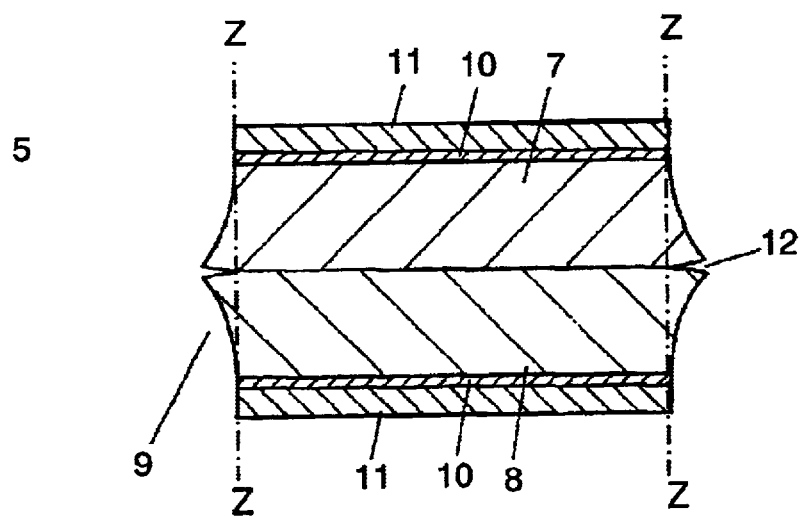
FIG. 9 is still another sectional view of the bonded quartz device in the midst of manufacturing process according to the first exemplary embodiment of this invention.

A method of calibrating a resonance frequency by wet etching will be described next. As shown in the sectional view of FIG. 8, the direct bonded quartz plate manufactured in this exemplary embodiment has a shape that a perimeter protuberates outwardly along the bonded plane between the upper and lower quartz plates 7 and 8. Having such shape, each of devices 6A and 6B of the angular velocity sensor shown in FIG. 1A is calibrated for the resonance frequency. This resonance frequency calibration is carried out by dissolving the protuberant portion of the quartz little by little by wet etching using ammonium fluoride—hydrofluoric acid aqueous solution. In this calibration process, the quartz is dissolved by approximately 5% of its total weight. FIG. 9 shows a cross-sectional shape of the quartz device after the dissolving process. In FIG. 9, lines Z—Z represents finite lines connecting between edges of the upper and lower electrodes.

After the wet etching is completed, there are slits 12 cut inwardly from both sides (protuberant portions) of the quartz plates 7 and 8 along their bonded plane as shown in FIG. 9. As is obvious from FIG. 9 when compared with FIG. 20, it is not likely that slits 12 advance inward beyond lines Z—Z in the case of this exemplary embodiment. Therefore, there is practically no change in the bonded area between upper and lower quartz plates 7 and 8. This inventor made a comparison of effective bonded areas corresponding to electrode portions of devices after their resonance frequencies were calibrated by wet etching 5% of total weight for each of quartz plates constituting the devices. It was confirmed that the effective bonded area of the device of the first exemplary embodiment shown in FIG. 9 was larger by 10% than the effective bonded area of the device of FIG. 20, which was processed by the conventional method of wet etching from both of the surfaces. In other words, the invented method can maintain sufficiently large an effective bonded area between the upper and lower quartz plates 7 and 8 even though the slit 12 is formed, thereby ensuring higher sensitivity by 10% or greater than that of the prior art.

In brief, a perimeter of the bonded quartz plate takes the shape that it protuberates outwardly at both sides when it is plasma dry-etched from the front surface and the back surface in the above manner. When the bonded quartz plate is once formed into the outwardly protuberant shape, there is produced only a shallow slit cut into the protuberant portion along the bonded plane, even after the resonance frequency calibration is made by dissolving it with wet etching, for instance. Therefore, there is no reduction in the bonded area of the original upper and lower quartz plates, so as to allow the resonance frequency calibration without degrading the sensitivity.

Figure 1B:
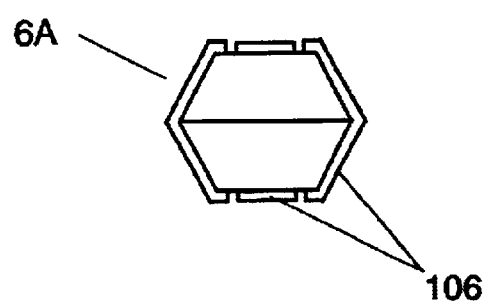
FIG. 1B is a sectional view of a bonded quartz device 6A of the angular velocity sensor of the present invention.
Figure 10:
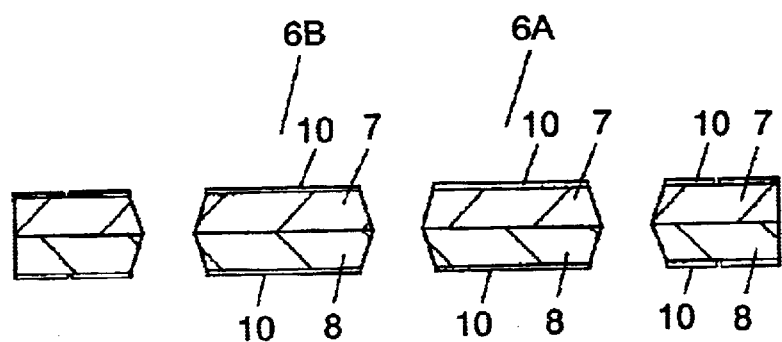
FIG. 10 is yet another sectional view of the bonded quartz device in the midst of manufacturing process according to the first exemplary embodiment of this invention.

FIG. 10 shows the quartz plate when nickel masks 11 are removed after completion of the process of FIG. 9, wherein there are only gold masks 10 present on the surfaces of quartz plate 7 and 8. Gold masks 10 may be used as electrodes as they are. If it is used as an angular velocity sensor in the instance of FIG. 1A, it requires additional gold electrodes on side surfaces in addition to those on the front and back surfaces. When this is the case, gold masks 10 shown in FIG. 10 are once removed, and new electrodes 106 are again formed thereafter on the front and back surfaces as well as the side surfaces of device 6A and 6B shown in FIGS. 1A and 1B, in order to avoid discrepancy in thickness of the electrode layers on the side surface.

(Second Exemplary Embodiment)

Figure 11:
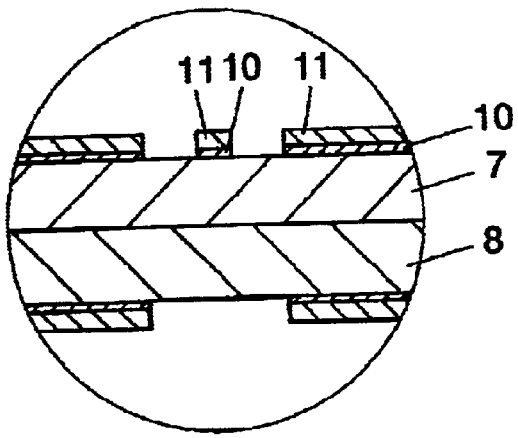
FIG. 11 is a sectional view of a bonded quartz device in the midst of manufacturing process according to second exemplary embodiment of this invention.
Figure 12:
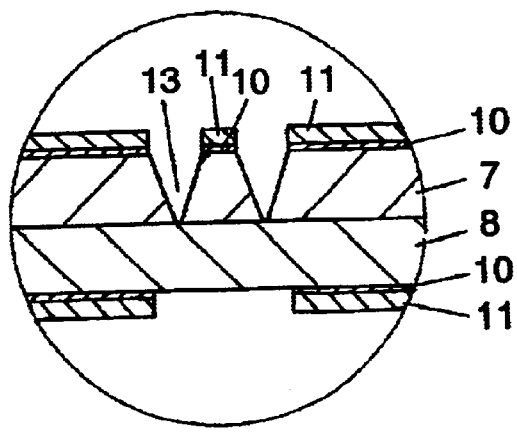
FIG. 12 is another sectional view of the bonded quartz device in the midst of manufacturing process according to the second exemplary embodiment of this invention.
Figure 13:
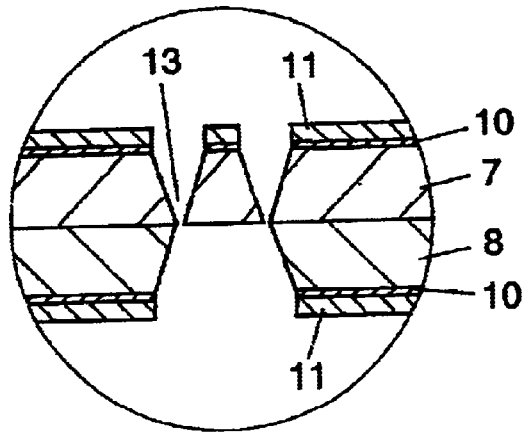
FIG. 13 is still another sectional view of the bonded quartz device in the midst of manufacturing process according to the second exemplary embodiment of this invention.

FIG. 11 through FIG. 13 illustrate another exemplary embodiment of the present invention.

As shown in FIG. 11, gold mask 10 and nickel mask 11 are formed on a center part within an open space, which corresponds to an area to be etched, of mask pattern. By leaving insular masks 10 and 11 on the center part in the area to be plasma dry-etched, as shown, trenches are cut into triangular shape in cross-section by the insular masks 10 and 11, and their cutting fronts reach lower quartz plate 8, as shown in FIG. 12, when the plasma dry etching is carried out from the upper surface.

When the plasma dry etching is carried out thereafter from the underside surface, a trench formed by the plasma dry etching first reaches trenches 13 of FIG. 12 cut from the upper surface, as shown in FIG. 13. As a result of the above processes, there is achieved a configuration in that upper and lower quartz plates 7 and 8 protuberate outward along the bonded plane, as already shown in FIG. 13. A shape of the etched side surfaces in this embodiment is analogous to that of FIG. 8. It thus provides like benefit as discussed in the first exemplary embodiment with reference to FIG. 9 for the subsequent process of wet etching to calibrate a resonance frequency. Advantage of forming the insular masks is that it makes easy the control of final depth of etching from one side surface.

The present invention is to form the protuberance having such a cross-sectional shape that the most protuberant ridge meets the bonded plane before the wet etching process is carried out for calibration of the resonance frequency. For this purpose, it is desirable to end the etching when the trench being etched from the one side reaches the bonded plane, as shown in FIG. 6. If an open area of the mask is wide, a final depth of the etching is regulated only by the etching time. Thus, there occurs such instances occasionally that the etching is terminated before the trench reaches the bonded plane from the one side surface as shown in FIG. 14A, or the etching is advanced excessively as shown in FIG. 15A, when the etching time changes or the etching condition varies. If the dry etching is continued from the other surface with the quartz plate in any of these conditions, the result may be any of asymmetrically etched surfaces 7b and 7c as shown in FIGS. 14B and 15B, in which the protuberant ridge does not meet the bonded plane.

To this contrary, a width of the open space in the mask is determined by varying a width of the insular mask shown in FIG. 13, in this exemplary embodiment. Since a depth of trench 13 depends not only on a length of the etching time but also greatly upon width of the open space in the mask, it is easier to control the etching depth in a manner that it reaches the bonded plane. That is, the insular mask additionally provided in the center of the open space can help produce the protuberance of a shape having the protuberant ridge meeting the bonded plane, accurately and easily.

The present invention as described above is the method comprising the steps of directly bonding at least two quartz plates, dry etching the bonded quartz plates with plasma from one side of the surfaces, and dry etching the bonded quartz plates with plasma thereafter from the other surface in a position corresponding to that of the previously dry etched surface. The dry etching takes a task of physical cutting when the bonded quartz plates are dry etched with plasma from one side and then from the other side of the surfaces. Therefore, unlike the prior art method of using wet etching, this method hardly causes deformation due to the difference in etching rate of the quartz surfaces.

In other words, when the plasma dry etching is made for the front and back surfaces in this manner, the bonded quartz plates become such a shape that areas around the bonded plane protuberate outward. Once the quartz plates are formed into the protuberant shape, there is produced only a shallow slit cut into the quartz plates at the protuberant portion along the bonded plane, even after resonance frequency calibration is made by dissolving them with such process as wet etching. If the cut-in slit is only so shallow as in this instance, a bonded area of the original upper and lower quartz plates is not reduced, and thereby the invention provides the piezoelectric device with high sensitivity.

What is claimed is:

1. A method of manufacturing piezoelectric device using direct bonded quartz plate, the method comprising the steps of:
   directly bonding two quartz plates;
   forming a top mask pattern on a top surface and a bottom mask pattern on a bottom surface of the bonded quartz plates;
   dry-etching the top surface with plasma until an etched trench reaches a bonded plane; and
   dry-etching the bottom surface with plasma.

2. The method of manufacturing piezoelectric device using direct bonded quartz plate as set forth in claim 1, wherein the step of dry-etching the bottom surface with plasma forms an etched surface into a protuberant shape having a protuberant ridge being along the bonded plane.

3. The method of manufacturing piezoelectric device using direct bonded quartz plate as set forth in claim 2, further comprising the step of dissolving a part of the dry-etched surface of the bonded quartz plates by wet etching.

4. The method of manufacturing piezoelectric device using direct bonded quartz plate as set forth in claim 1,
   wherein the step of forming the mask pattern forms a top mask pattern including an insular mask in the center of an open area of the mask pattern on the top surface, and the bottom mask pattern not including the insular mask on the bottom surface,
   wherein the step of dry-etching the top surface with plasma etches down to a depth of the bonded plane.

5. The method of manufacturing piezoelectric device using direct bonded quartz plate as set forth in claim 4, further comprising the step of dissolving a part of the dry-etched surface of the bonded quartz plates by wet etching.

6. The method of manufacturing piezoelectric device using direct bonded quartz plate as set forth in claim 4, wherein the step of dry-etching the bottom surface with plasma forms an etched surface into a protuberant shape having a protuberant ridge being along the bonded plane.

7. The method of manufacturing piezoelectric device using direct bonded quartz plate as set forth in claim 6, further comprising the step of dissolving a part of the dry-etched surface of the bonded quartz plates by wet etching.

8. The method of manufacturing piezoelectric device using direct bonded quartz plate as set forth in claim 1, further comprising the step of dissolving a part of the dry-etched surface of the bonded quartz plates by wet etching.

9. The method of manufacturing piezoelectric device using direct bonded quartz plate as set forth in claim 1, wherein the step of forming the mask pattern is to form a mask pattern in a shape of tuning fork.

10. The method of manufacturing piezoelectric device using direct bonded quartz plate as set forth in claim 1, the method being used for manufacturing the piezoelectric device adaptable for an angular velocity sensor.

11. A method of manufacturing piezoelectric device using direct bonded quartz plate, the method being used to form a tuning fork type piezoelectric device for angular velocity sensor, the method comprising the steps of:

directly bonding two quartz plates;

forming a top mask pattern on a top surface and a bottom mask pattern on a bottom surface of the bonded quartz plates;

dry-etching the top surface with plasma until an etched trench reaches a bonded plane; and dry-etching the bottom surface with plasma.

12. The method of manufacturing piezoelectric device for angular velocity sensor using direct bonded quartz plate as set forth in claim 11, wherein the step of dry-etching the bottom surface with plasma forms an etched surface into a protuberant shape having a protuberant ridge being along the bonded plane.

13. The method of manufacturing piezoelectric device for angular velocity sensor using direct bonded quartz plate as set forth in claim 11, wherein the step of forming the mask pattern forms a top mask pattern including an insular mask in the center of an open area of the mask pattern on the top surface, and the bottom mask pattern not including the insular mask on the bottom surface, wherein the step of dry-etching the top surface with plasma etches down to a depth of the bonded plane.

14. The method of manufacturing piezoelectric device for angular velocity sensor using direct bonded quartz plate as set forth in claim 13, wherein the step of dry-etching the bottom surface with plasma forms an etched surface into a protuberant shape having a protuberant ridge being along the bonded plane.

15. The method of manufacturing piezoelectric device for angular velocity sensor using direct bonded quartz plate as set forth in claim 13, further comprising the step of dissolving a part of the dry-etched surface of the bonded quartz plates by wet etching.

16. The method of manufacturing piezoelectric device for angular rate sensor using direct bonded quartz plate as set forth in claim 15, further comprising the step of:

removing the mask pattern; and forming an electrode.

17. The method of manufacturing piezoelectric device for angular velocity sensor using direct bonded quartz plate as set forth in claim 11, further comprising the step of dissolving a part of the dry-etched surface of the bonded quartz plates by wet etching.

18. The method of manufacturing piezoelectric device for angular velocity sensor using direct bonded quartz plate as set forth in claim 17, further comprising the step of:

removing the mask pattern; and forming an electrode.

* * * * *